US006854099B2

(12) United States Patent
Dewey, III et al.

(10) Patent No.: US 6,854,099 B2
(45) Date of Patent: Feb. 8, 2005

(54) BALANCED ACCURACY FOR EXTRACTION

(75) Inventors: Lewis W. Dewey, III, Wappingers Falls, NY (US); Peter A. Habitz, Hinesburg, VT (US); Thomas G. Mitchell, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 10/064,300

(22) Filed: Jul. 1, 2002

(65) Prior Publication Data

US 2004/0003356 A1 Jan. 1, 2004

(51) Int. Cl.[7] ............................................. G06F 17/50
(52) U.S. Cl. ............................. 716/5; 716/4; 716/10
(58) Field of Search .................... 716/1, 4–6, 10–14, 716/18

(56) References Cited

U.S. PATENT DOCUMENTS

| | | | | |
|---|---|---|---|---|
| 5,471,409 A | * | 11/1995 | Tani | 716/5 |
| 5,903,469 A | * | 5/1999 | Ho | 716/5 |
| 6,138,267 A | * | 10/2000 | Murai | 716/5 |
| 6,182,269 B1 | | 1/2001 | Laubhan et al. | 716/5 |
| 6,289,412 B1 | | 9/2001 | Yuan et al. | 711/11 |
| 6,499,129 B1 | * | 12/2002 | Srinivasan et al. | 716/4 |

* cited by examiner

*Primary Examiner*—Matthew Smith
*Assistant Examiner*—Paul Dinh
(74) *Attorney, Agent, or Firm*—McGinn & Gibb, PLLC; Richard M. Kotulak, Esq.

(57) ABSTRACT

A method and system for performing parasitic extraction, wherein the method comprises calculating the minimum output impedance for a network-connected component comprising a plurality of ports thereby producing a labeled impedance, estimating the minimum output impedance for every net, comparing the labeled impedance with the estimated impedance, and selecting the net which needs to be extracted based on a ratio of values of the labeled impedance and the estimated impedance. The step of calculating comprises labeling every port with a minimum size of port impedance, a resistance from a port to power, and a minimum capacitance of a port-net inside the network connected component. The step of estimating comprises using a geometry of segments of the net comprising a summation of area and perimeter values of all the segments of the net, or calculating a resistance over a length of a total net versus an average width of the net.

27 Claims, 4 Drawing Sheets

BALANCED ACCURACY FOR EXTRACTION

BACKGROUND OF THE INVENTION

1. Field of the Invention

The present invention generally relates to circuit performance detection systems, and more particularly to a network accuracy parasitic extraction system for determining the accuracy and sensitivity requirements for circuit networks.

2. Description of the Related Art

Parasitic extraction programs calculate the capacitances, resistances, and inductances (RLC) for all conductors connecting the circuit elements and add devices, which exist in the circuit layout and those which are not part of the designed circuitry. While this parasitic RLC information can have a small impact on the circuit performance it can very quickly add to the number of elements being analyzed or simulated and can have a significant impact on the simulation net list size, memory, and performance.

These parasitic extracted networks (parasitic resistance connected nodes) fall into at least three categories: networks that have insignificant or negligible capacitance and resistance when compared to the "designed circuitry", networks that have small but relevant resistance and capacitance when compared to the "designed circuitry", and networks whose parasitic contribution can be dominant.

When using a system to design microelectronic devices, a designer usually generates a behavioral description using a high-level description language or a circuit level description using a schematic capture tool. Then, the designer can incrementally simulate and verify the design using logic level models incorporating accurate timing and delay information. Here, the design is represented as logic cells having input and/or output ports. Furthermore, the circuit description includes structures called nets, which interconnect the ports on various logic cells and serve as the wiring connection for the circuit.

In every circuit the parasitic resistances and capacitances add to the non-parasitic resistances and capacitances which are part of the device model and are called out by the design schematic. The sum of the schematic and the parasitic resistance and capacitances impact circuit delay and other circuit performance parameters such as power, noise, skew, etc. Comparing a quick estimate of the expected parasitic values with the already existing schematic values allows the circuit designer to set the accuracy level and to decide whether the parasitic value is needed at all. In order to accomplish this, a system is needed to present the existing values to the extractor and to quickly estimate the expected values.

Conventional extraction programs simply ignore all elements smaller than a user-defined threshold. This passes the responsibility to do so to the user, and because the sensitivities to every net is different, the most sensitive net determines the threshold. Hence, these conventional processes are not efficient, and indeed involve a lot of wasted run time. Moreover, these conventional systems are also inaccurate as many small elements can add up to ignored values significantly larger than the threshold.

Furthermore, other conventional extraction processes apply RLC reduction routines after extraction. While this is more efficient than the programs described above, they increase the overall run-time and do not include circuit sensitivities. Still other conventional programs first run with a rough extraction, then run a timing estimate, and then determine where more accuracy is needed. While these methods serve a useful purpose, they require integration of the timing tool into the extraction tool, which unfortunately adds the additional run time of a "wasted" timing analysis.

Before the circuit layout is performed, the actual interconnect lengths between circuit elements remain unknown. As mentioned, estimates of parasitic resistance and capacitance may be used for logic delay calculations in the circuit. However, after the circuit layout is performed, the actual physical layout (length) of each net is identified, and a variety of improved approximations of interconnect resistance and capacitance (RC), obtained by parasitic RC extraction, may be employed in logic delay calculations.

As device and interconnect geometries decrease, the influence of interconnect impedance on total logic delay increases. Thus, the delay attributed to the interconnect impedance may rival or exceed the delay attributed to the transistor behavior of the driver cell and the effect of the load capacitances presented by load cells on the net. The impact of interconnect delay is so significant that a dominance of interconnect delay over gate delay in deep submicron IC technology is widely asserted in the field of electronic design. Accordingly, improvements in parasitic RC extraction can provide more accurate design simulations by improving overall logic delay accuracy. Thus, there remains a need for a new system and process to efficiently decide, in advance, the accuracy or sensitivity requirements for every network, and to increase the efficiency of a parasitic extraction program for networks.

SUMMARY OF THE INVENTION

In view of the foregoing and other problems, disadvantages, and drawbacks of the conventional parasitic extraction programs the present invention has been devised, and it is an object of the present invention to provide an efficient system and method for performing parasitic extraction.

In order to attain the object suggested above, there is provided, according to one aspect of the invention a computer system executing a method for performing parasitic extraction, wherein the method comprises the steps of calculating the minimum output impedance for a network-connected component comprising a plurality of ports, estimating the minimum output impedance for every net, comparing the labeled impedance with the estimated impedance, and selecting the net which needs to be extracted based on a ratio of values of the labeled impedance and the estimated impedance.

The step of calculating the minimum output impedance for a network-connected component comprises labeling every port with a minimum size of port impedance, a resistance from a port to power, and a minimum capacitance of a port-net inside the network connected component. Furthermore, the step of estimating the minimum output impedance for every net comprises using a geometry of segments of the net, wherein the geometry segments comprise a summation of area and perimeter values of all of the segments of the net. Alternatively, the step of estimating the minimum output impedance for every net comprises calculating a resistance over a length of a total net versus an average width of the net. Moreover, the step of selecting determines what the accuracy requirements are for every net.

The present invention allows the ability of efficiently deciding, in advance, the accuracy or sensitivity requirements for every network. This network accuracy is then used as input to the extraction tool, which in turn has a large positive impact on the efficiency of the extraction program and the usability and size of the extraction output.

There are several benefits of the present invention. First, the present invention greatly simplifies the parasitic impedance extraction process by reducing the timing (run times) and increasing the efficiency in which parasitic extraction process occurs. Moreover, the present invention has the ability to determine what the accuracy requirements are for every net. Additionally, the present invention provides for a more accurate and more complex parasitic resistance and capacitance model and a more accurate detailed parasitic extraction process without increasing run times by comparing the maximum estimates with the minimum port impedances, which allows the ability to categorize the nets for their parasitic accuracy needs.

Furthermore, the present invention simplifies the decision process in TD (Trapezoidal Decomposition) by determining, at the beginning of the decision tree, which shapes can be skipped thereby improving the capacitance extraction performance. Also, the present invention compares a quick estimate of the expected parasitic values with the already existing schematic values, which allows the circuit designer to set the accuracy level and to decide whether the parasitic value is needed at all.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENT OF THE INVENTION

Figure 1:
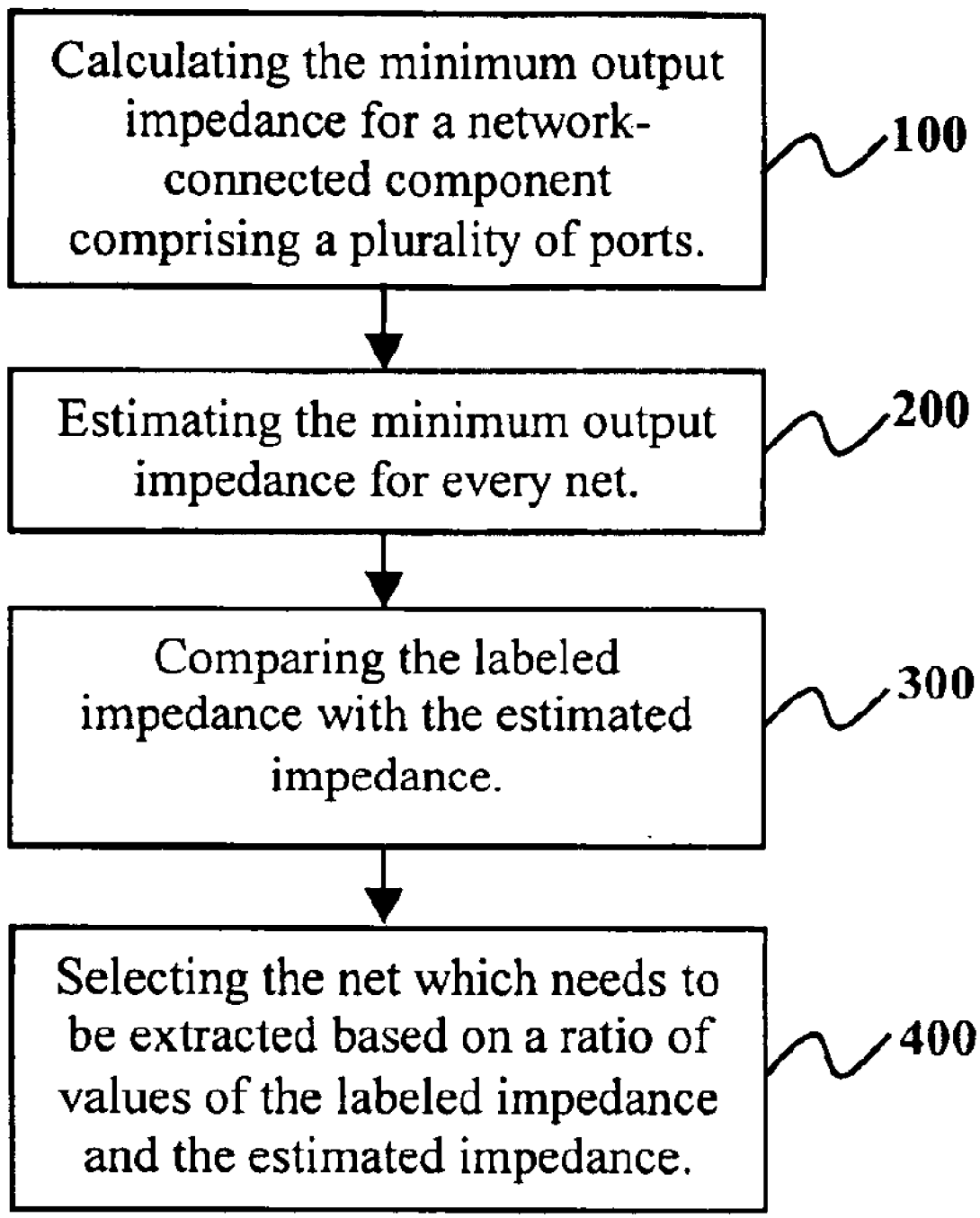
FIG. 1 is a flow diagram illustrating a preferred method of the invention.

As previously mentioned, there is a need for a new system to efficiently decide, in advance, the accuracy or sensitivity requirements for every network, and to increase the efficiency of a parasitic extraction program for networks. If it can be determined when to ignore, or when to relax, or when to extract with high accuracy, then there can be a significant positive impact on post extraction simulation. The reasoning behind categorizing parasitic networks is based on the assumption that the "designed circuitry," as represented by the schematic, will deliver most of the performance in all but a small percentage of networks that may include extensive wiring or other significant parasitic structures.

For example, if it is assumed that 80% of the circuit performance is fixed through designed devices, and the goal is to deliver a 5% performance accuracy, then the extraction or parasitic elements may be 25% inaccurate. Moreover, if it is further assumed that extraction accuracy capabilities of 10% are desired, then, in this case, the current extraction capability may be relaxed and still remain within 5% of the performance accuracy. Thus, this relaxation may be used to gain extraction speed and to reduce the complexity of the output net list. This output net list is a logic representation of how the transistors are connected.

Referring now to the drawings, and more particularly to FIGS. 1 through 4, there are shown preferred embodiments of the method and system according to the present invention. Specifically, in the flow diagram illustrating a preferred method of the present invention shown in FIG. 1, the method for performing parasitic extraction method comprises the steps of calculating 100 the minimum output impedance for a network-connected component comprising a plurality of ports 607 thereby producing a labeled impedance, estimating 200 the minimum output impedance for every net 605 of an integrated circuit device 610 based on the calculating step 100, comparing 300 the labeled impedance with the estimated impedance, and selecting 400 the net which needs to be extracted based on a ratio of values of the labeled impedance and the estimated impedance.

The step of calculating 100 comprises labeling every one of the ports 607 with a minimum size of port impedance inside the network-connected component. Alternatively, the step of calculating 100 comprises labeling every one of the ports 607 with a resistance from a port-to-power inside the network connected component. Still alternatively, the step of calculating 100 comprises labeling every one of the ports 607 with a minimum capacitance of a port-net inside the network connected component.

The step of estimating 200 comprises using a geometry of segments of the net 605, wherein the geometry of segments comprise a summation of area and perimeter values of all the segments of the net 605. Furthermore, the step of estimating 200 comprises calculating the resistance over the length of the total net 605 versus an average width of the net 605. The step of selecting 400 determines what the accuracy requirement is for every net 605. For example, the accuracy requirement may simply be based on the length dependent formulas given in the estimating step 200 above, or it may require a selection of the most efficient extraction method, or it may require selecting the shortest network description possible.

Figure 2:
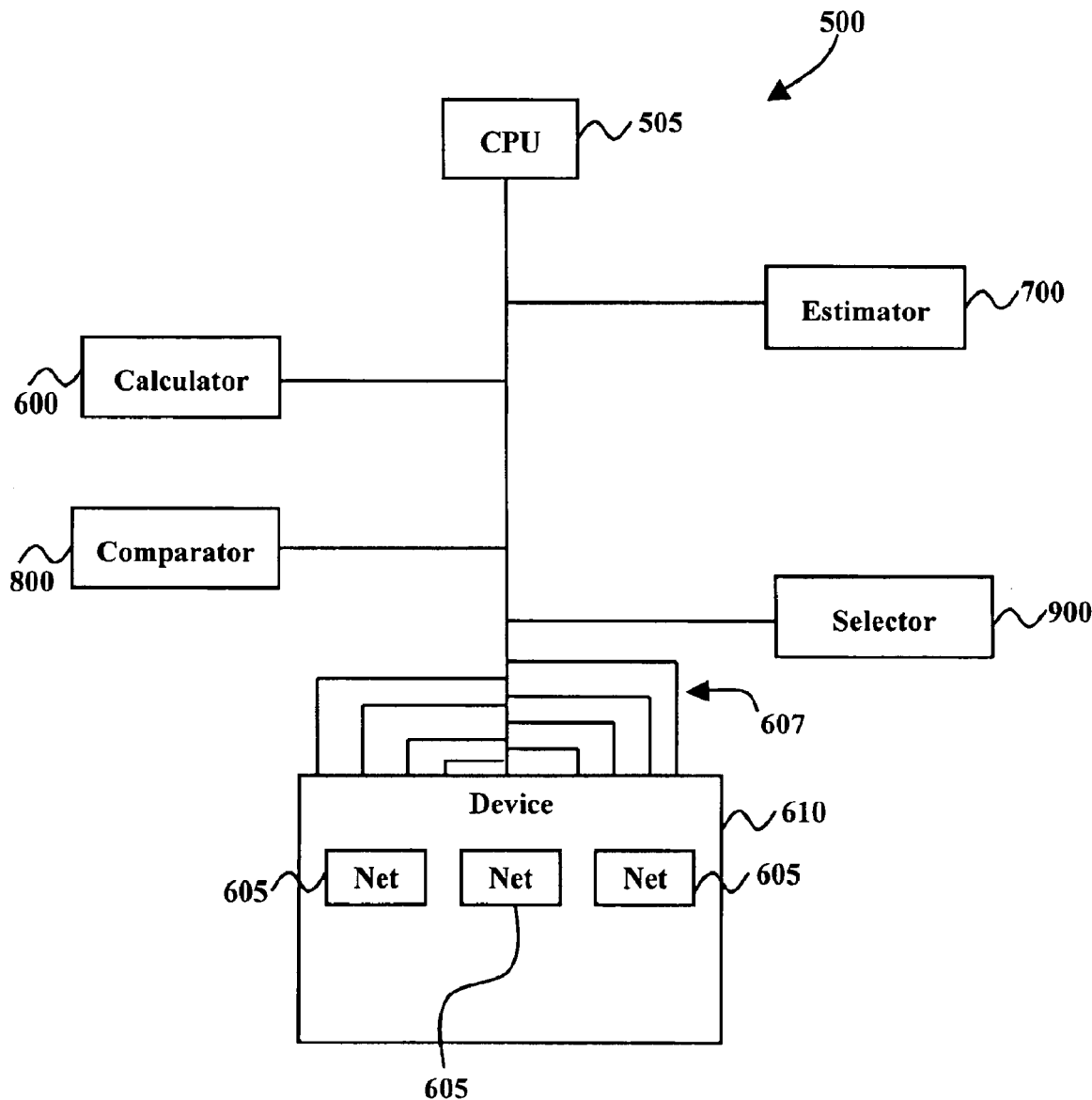
FIG. 2 is a computer system diagram according to the present invention.

FIG. 2 shows a computer system 500 for performing parasitic extraction, wherein the computer system 500 comprises a central processing unit 505, a calculator 600 performing the calculating step 100, an estimator 700 performing the estimating step 200, a comparator 800 performing the comparing step 300, and a selector 900 performing the selecting step 400.

The port impedances can be separated into output and input impedances of the devices or subcircuits not included in the extraction. The values are determined by analyzing the schematic netlist prior to the extraction. Every device output port, such as an FET source or drain, is traced in the schematic to a power supply. The minimum resistances on this trace are added to deliver the output resistance and the minimum device capacitance on the source or drain port give the impedance of this device node. An input port like a gate has no resistive path so that the input impedance is the gate capacitance of this FET. These values are taken from the device models and are then used for port labels.

Figure 3:
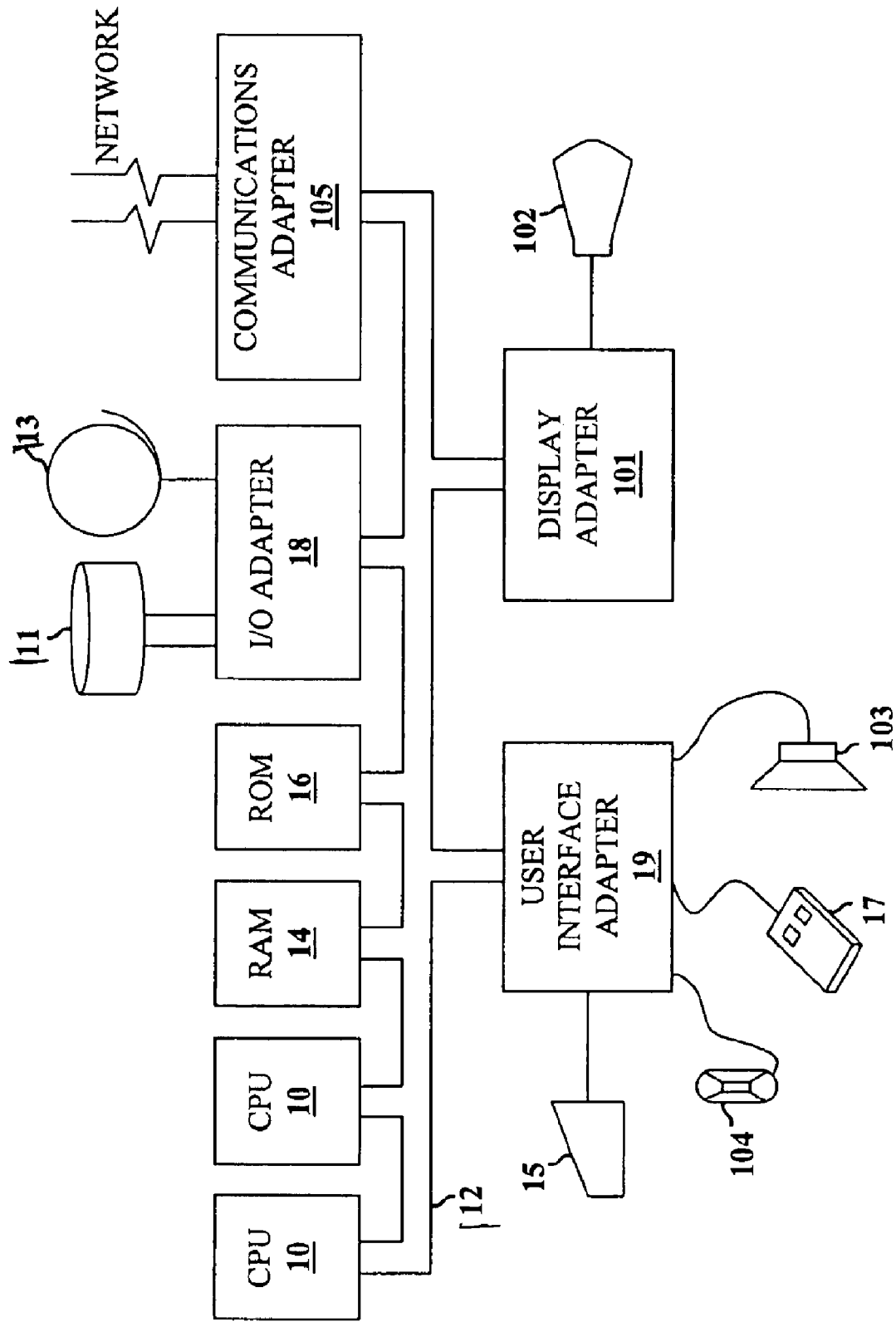
FIG. 3 is a system diagram according to the present invention.

A representative hardware environment for practicing the present invention is depicted in FIG. 3, which illustrates a typical hardware configuration of an information handling/computer system in accordance with the present invention, having at least one processor or central processing unit (CPU) 10. The CPUs 10 are interconnected via system bus 112 to random access memory (RAM) 14, read-only memory (ROM) 16, an input/output (I/O) adapter 18 for connecting peripheral devices, such as disk units 111 and tape drives 113, to bus 112, user interface adapter 19 for connecting keyboard 15, mouse 17, speaker 103, microphone 104, and/or other user interface devices such as touch screen device (not shown) to bus 112, communication adapter 105 for connecting the information handling system to a data processing network, and display adapter 101 for connecting bus 112 to display device 102. A program storage device readable by the disk or tape units is used to load the instructions, which operate the invention which is loaded onto the computer system 500.

As mentioned, the present invention labels every port with the minimum size of port impedance, the resistance from the port-to-power, and the minimum capacitance of the port-net inside of the circuit, or Channel Connected Component (CCC). The present invention determines the "minimum size" by using the shortest path to the supply voltage and comparing the minimum values which the device model can provide for the transistor. Moreover, this occurs before the extraction is done. Also, there is a pre-analysis step which calculates the port impedances and adds the results to the input data by labeling the ports. The port-to-power refers to the connection from an FET or port into the power connection of the circuit, and the port-net refers to the net which touches the port. Moreover, a transistor gate port contains the minimum gate capacitance and a source/drain port, the minimum drain capacitance, and the minimum resistance through the FET in full linear mode, which is the smallest resistance which the transistor has. Essentially, the transistor gate port adds labels to the ports and identifies which ports contain resistance and which contain capacitance.

When the source of the transistor is not connected to a supply, the source can be traced, in the schematic circuit design, to the supply giving a larger resistor value. This is helpful because the larger the resistor value, the more the resistance becomes irrelevant and therefore is not extracted. Thus, the present invention allows for efficiencies to be achieved, which conventional systems cannot produce, because according to the present invention, only the lowest resistance value needs to be determined, while all other larger resistance values may simply be disregarded due to the pre-characterization of the schematic netlist. Therefore, the minimum output impedance for the CCC can be easily calculated. Determining this minimum output impedance is necessary because it identifies the resistance of the design circuitry. The values for the label depend on the device type and design dimension and layout ground rules and can be estimated out of the schematic. The ideal resistance values are estimated by tracing the netlist from a supply to the least resistive path and adding the resistors along the path. The capacitance is taken from the device models, and represents the smallest value under any bias conditions. By using a more efficient methodology for this analysis several conditions may be excluded, which are logically impossible, thereby achieving even better device estimates. According to the present invention, these are not timing analysis runs, but rather are switch-level logic analysis and simple resistance adders. Thus, this pre-analysis is very fast and can be used on very large designs.

The accuracy requirement for the data on these labels is not significant (20%–30% is sufficient) as they are only used for subsequent accuracy estimates, such as the accuracy of the performance as a result of delay. Moreover, the values needed can be added to the port description of the schematic or to the port label in the shape (GDS2 or GL1) data. Again, these shapes refer to the geometric shapes, which are incorporated into the masks for patterning the integrated circuits. The schematic refers to the design of the circuitry without the power settings and without the wiring. The schematic illustrates only intended transistors, which helps in the analysis of the circuit. This step requires additional processes, which will work with the schematic net list, before extraction.

Figure 4:
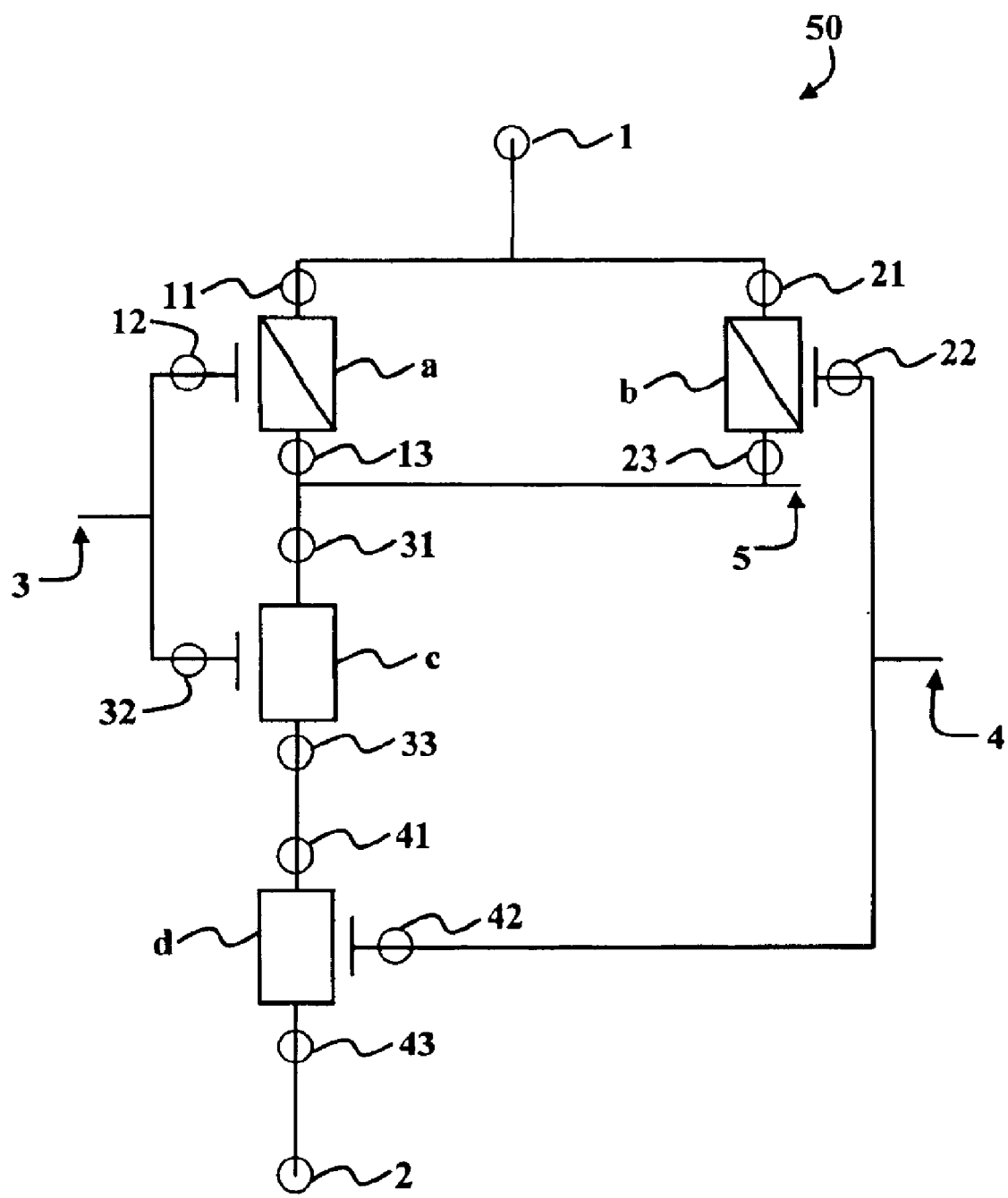
FIG. 4 is a schematic circuit diagram according to the present invention.

An example of this process is presented in FIG. 4, which illustrates a simple FET logic circuit 50. The devices a, b are PFETs, and the devices c, d, are NFETs. The circuit 50 further comprises power supply nodes 1, 2, input nodes 3, 4, and output node 5. The power supply nodes 1, 2 are connected to the devices ports 11, 21, 43. The device impedances on these ports 11, 21, 43 have no resistance, and only have a capacitance. The input nodes 3, 4 are connected to the device (gate) ports 12, 22, 32, 42. These port impedances have infinite resistance and significant capacitances. The capacitance on ports 33, 41 is the source capacitance of device c and the drain capacitance of the device d, respectively. The resistances are found in the following manner. Port 41 is connected to power supply node 2 (ground) through the NFET d. Port 41 is connected to power supply node 1 through FET a, or alternatively, FETs b, c. If the sum of the a+c device resistance is larger than the resistance of device d alone, then the device d will be used for the impedance on port 41.

For ports 13, 23, 31 the capacitance is the drain capacitance from the devices a, b, c. The resistance is the same for these ports. Also, these ports can connect to a supply either via device a or b or via both devices c+d. The smallest resistance of these three paths will be used for the resistance on all three ports.

Additionally, the forward annotation step can transfer the data from the schematic into the shape database by tracing the shape database to a net list. In the forward annotation step the schematic circuitry is matched with the physical layout, and the names and attributes written in the schematic are then transferred as attributes to the appropriate shape data. As the extraction program works with the shape data, it can now read and analyze the port data created by the analysis of the schematic. Thereafter, this net list is compared to the schematic net list to find the equivalent transistors.

Finally, the data is transferred into the specification as design parameters. Thus, there are two net lists, one based on logic and another based on shapes. Also, it is possible to add a wire type description to this step as a parameter to the interconnect nets, which include the wire width used for this connection. Only the wire width is necessary to be used as a parameter, thereby leaving only the length to be discovered in order to determine the resistance. The wire width data is very convenient for the estimator to quickly find an upper limit for the extracted interconnect resistance and capacitance. The maximum resistance and capacitance which a wire of the given width can have is made available to the extractor. The extractor only needs the length of the wire for a good estimate of the upper limit of the parasitic interconnect impedance. This is another example of the efficiency of the present invention.

Every net, before it is extracted, can be first roughly estimated to the size of the expected value and then is compared with the label. The estimates for maximum resistance can be done over a total net length using average wire width. If provided, this value can be taken from the schematic wire type information. Moreover, the estimates for maximum capacitance can be the summation of the area and perimeter values of all segments of the net, disregarding any environment. Comparing these maximum estimates with the minimum port impedances calculated previously allows the ability to categorize the nets for their parasitic accuracy needs. In conventional systems, port impedances are not available to the extractor because it has previously required significant work in creating the programs to find and make available the port impedances for extraction. Thus, no other systems exists which can accomplish this.

For example, if the estimates show maximum values less than 5% of the label values, then the net does not need to be extracted and can be skipped. If the estimates show maximum values smaller than 15–20% of the value labels, then the estimates themselves might be good enough to be used. When the relative size of a contribution goes down, the acceptable absolute error in this contribution goes up. Here, small contributions can be ignored.

The next category uses high efficiency options, which use local average environments, and require a regular 10% accurate extraction, and for the parasitic dominated networks it is switched to 5% with better accuracy. The overall accuracy requirement, discussed in the examples as 5%, may also be generated through user input, wherein the user determines how much accuracy is desired for a particular application.

According to the present invention, knowing that capacitance values for certain nets do not need to be extracted simplifies the decision process in TD (Trapezoidal Decomposition). The analysis provided by the present invention delivers the accuracy need of the parasitic net connections. Extraction with trapezoidal decomposition is not net driven, but handles edges of the shape data in a geometric sweep through the data. This part of the implementation describes how a program based on TD can take advantage of the knowledge of the accuracy need for efficiency of the extraction in addition to the reduction of the overall output file size. According to the present invention, Trapezoidal Decomposition refers to a method in which it is determined where edges are located in the shape data. Using the net-name of source nets allows a faster decision during the most time-consuming process to find which shapes contribute to which capacitance. The present invention allows the ability to determine, at the beginning of the decision tree, which shapes can be skipped and in this way improves the capacitance extraction performance. However, the present method will continue to build all shapes, and thus does not impact the accuracy on any net, which is not selected as unneeded. The present invention can take advantage of the knowledge that certain nets do not need high accuracy by applying the less accurate conventional methods using an average local pattern density.

The present invention also allows the ability to find complete areas of design data with many (small) nets which do not need extraction. Added to this pool of unimportant nets can be the shapes of nets treated before with the conventional methods and taken out of further extraction this way. All of those shapes including their extension shapes are tied to AC ground, and can be merged, thereby reducing their edge count. If the accuracy estimate allows all small coupling capacitances between nets, then only the lumped capacitance to AC ground has to be considered. This is equivalent to the calculation of any single net to all surrounding nets tied to ground. Because many shapes, which are close to each-other behave like a plate, tying the shapes to ground, can be done geometrically by creating a new shape, which has wires and spaces merged together. This improves efficiency without losing accuracy. The present invention allows the extractor to switch the extraction method dynamically according to the accuracy need. In this way always the most efficient method is used and the most compact parasitic model is created. This further improves the efficiency of the extraction process.

In general, all shapes on the same net and the same level can be merged to reduce the edge-count. It is important to reduce the edge-count because it creates a time saving and cost saving efficiency, which conventional systems do not provide. Essentially, the more corners to be counted (measured), the longer it takes to run the processes. The present method is especially effective if there are a large number of shapes available for cap extraction.

One of the biggest advantages of the present invention is for programs which extract on a net-to-net basis, such as CHIPEDIT, available from IBM, Armonk, N.Y., USA. For CHIPEDIT, the designed capacitance and resistance values are already available in the NDR's and Noise Abstracts. Moreover, the capacitance and resistance estimates are available in the methodology after the Steiner estimates are measured. The Steiner estimates refer to the "Manhattan" distance (rectangular distance) between two points. This information only needs to be used to focus the extraction effort on the important nets.

Thus, this allows the ability to efficiently adjust the extraction accuracy, and the ability to evaluate some interconnects on a net-by-net basis, thus delivering a much faster overall extraction code, and also a more compact extracted deck, which does not contain unnecessary small contributions.

Upon completion of the extraction, it may be necessary to simplify the network. Thus, the present invention provides means to accomplish this by performing a network reduction comparison of the net 605, after extraction, based on the predetermined accuracy requirements identified above. This may involve finding networks which do not require any resistance (only capacitive load networks), or networks which handle a single term, or a distributive net.

Specifically, the present method can also be used to reduce and simplify a net list already extracted in full accuracy. Knowledge of the accuracy requirements does not only allow the ability to use the most efficient extraction algorithm, but it can also be used to simplify a netlist extracted in full detail by being a highly coupled and distributed network. The transistor value labels established by the analysis of the schematic can be used to remove and combine resistances and capacitances transparent to the overall accuracy of the deck. Depending on the accuracy need of the net, the capacitances can be moved to one node of the net and the resistance, in series, can be added together. This simplifies the network, removes internal nodes created by resistor extraction, and recombines capacitances and reattaches coupling capacitances to load capacitances.

Preferably, the present application is used in conjunction with systems when the extraction engine is not net based. As the decision for simplification is done on a net-by-net basis it is most easily applied to a process which operates on a net to net basis. Therefore an extractor operating on itself on a net-by-net basis can avoid creating resistors, which are not needed within the given accuracy, while other extractors can additionally benefit from the network reduction step.

There are several benefits of the present invention. First, the present invention greatly simplifies the parasitic impedance extraction process by reducing the timing (run times) and increasing the efficiency in which parasitic extraction process occurs. Moreover, the present invention has the ability to determine what the accuracy requirements are for every net. Additionally, the present invention provides for a more accurate and more complex parasitic resistance and capacitance model and a more accurate detailed parasitic extraction process without increasing run times by comparing the maximum estimates with the minimum port impedances, which allows the ability to categorize the nets for their parasitic accuracy needs.

Furthermore, the present invention simplifies the decision process in TD (Trapezoidal Decomposition) by determining, at the beginning of the decision tree, which shapes can be skipped thereby improving the capacitance extraction performance. Also, the present invention compares a quick estimate of the expected parasitic values with the already existing schematic values, which allows the circuit designer to set the accuracy level and to decide whether the parasitic value is needed at all.

While the invention has been described in terms of preferred embodiments, those skilled in the art will recognize that the invention can be practiced with modification within the spirit and scope of the appended claims.

What is claimed is:

1. A method for performing parasitic extraction for a component having a plurality of nets and ports, said method comprising:

calculating a minimum output impedance for each of said ports;

estimating a maximum parasitic impedance for each of said ports;

determining an amount by which said maximum parasitic impedance exceeds said minimum output impedance for each of ports;

extracting actual parasitic impedance values from ports where said maximum parasitic impedance exceeds said minimum output impedance by more than a predetermined amount; and categorzing said nets for their parasitic accuracy needs based on a comparison of said minimum output impedance with said maximum parasitic impedance.

2. The method of claim 1, wherein said step of calculating of said minimum output impedance includes tracing resistances within each net in said component from a power supply along a least resistive path and adding resistances of resistors along said path.

3. The method of claim 1, wherein said step of calculating of said minimum output impedance includes calculating minimum capacitances within each net in said component, considering all bias conditions.

4. The method of claim 1, wherein said estimating of said maximum parasitic impedance is based on area and perimeter values of all nets in said component.

5. The method of claim 1, wherein said estimating of said maximum parasitic impedance is based on a geometry of nets in said component.

6. The method of claim 5, wherein said geometry comprise a summation of area and perimeter values of all said nets in said component.

7. The method of claim 1, wherein said estimating of said maximum parasitic impedance comprises calculating a resistance of a total length of wiring having an average wire width within an associated net within said component.

8. A method for performing parasitic extraction for a component having a plurality of nets and ports, said method comprising:

calculating a minimum output impedance for each of said ports;

estimating a maximum parasitic impedance for each of said ports;

determining an amount by which said maximum parasitic impedance exceeds said minimum output impedance for each of ports;

extracting actual parasitic impedance values from ports where said maximum parasitic impedance exceeds said minimum output impedance by more than a predetermined amount;

using said estimated maximum parasitic impedance as said actual parasitic impedance for ports where said maximum parasitic impedance does not exceed said minimum output impedance by more than said predetermined amount; and categorizing said nets for their parasitic accuracy needs based on a comparison of said minimum output impedance with said maximum parasitic impedance.

9. The method of claim 8, wherein said step of calculating of said minimum output impedance includes tracing resistances within each net in said component from a power supply along a least resistive path and adding resistances of resistors along said path.

10. The method of claim 8, wherein said step of calculating of said minimum output impedance includes calculating minimum capacitances within each net in said component, considering all bias conditions.

11. The method of claim 8, wherein said estimating of said maximum parasitic impedance is based on area and perimeter values of all nets in said component.

12. The method of claim 8, wherein said estimating of said maximum parasitic impedance is based on a geometry of nets in said component.

13. The method of claim 12, wherein said geometry comprise a summation of area and perimeter values of all said nets in said component.

14. The method of claim 8, wherein said estimating of said maximum parasitic impedance comprises calculating a resistance of a total length of wiring having an average wire width within an associated net within said component.

15. A system for performing parasitic extraction for a component having a plurality of nets and ports, said system comprising:

a calculator adapted to calculate a minimum output impedance for each of said ports;

an estimator adapted to estimate a maximum parasitic impedance for each of said ports;

a comparator adapted to determine an amount by which said maximum parasitic impedance exceeds said minimum output impedance for each of ports; and a selector adapted to extract actual parasitic impedance values from ports where said maximum parasitic impedance exceeds said minimum output impedance by more than a predetermined amount, wherein said nets are categorized for their parasitic accuracy needs based on a comparison of said minimum output impedance with said maximum parasitic impedance.

16. The system of claim 15, wherein calculator is further adapted to trace resistances within each net in said component from a power supply along a least resistive path and add resistances of resistors along said path.

17. The system of claim 15, wherein said calculator is further adapted to calculate minimum capacitances within each net in said component, considering all bias conditions.

18. The system of claim 15, wherein said estimator bases said estimate of said maximum parasitic impedance on area and perimeter values of all nets in said component.

19. The system of claim 15, wherein said estimator bases said estimate of said maximum parasitic impedance on a geometry of nets in said component.

20. The system of claim 19, wherein said geometry comprise a summation of area and perimeter values of all said nets in said component.

21. A program storage device readable by machine, tangibly embodying a program of instructions executable by said machine to perform a method for performing parasitic extraction for a component having a plurality of nets and ports, said method comprising:

calculating a minimum output impedance for each of said ports;

estimating a maximum parasitic impedance for each of said ports;

determining an amount by which said maximum parasitic impedance exceeds said minimum output impedance for each of ports;

extracting actual parasitic impedance values from ports where said maximum parasitic impedance exceeds said minimum output impedance by more than a predetermined amount; and categorizing said nets for their parasitic accuracy needs based on a comparison of said minimum output impedance with said maximum parasitic impedance.

22. The program storage device of claim 21, wherein said step of calculating of said minimum output impedance includes tracing resistances within each net in said component from a power supply along a least resistive path and adding resistances of resistors along said path.

23. The program storage device of claim 21, wherein said step of calculating of said minimum output impedance includes calculating minimum capacitances within each net in said component, considering all bias conditions.

24. The program storage device of claim 21, wherein said estimating of said maximum parasitic impedance is based on area and perimeter values of all nets in said component.

25. The program storage device of claim 21, wherein said estimating of said maximum parasitic impedance is based on a geometry of nets in said component.

26. The program storage device of claim 25, wherein said geometry comprise a summation of area and perimeter values of all said nets in said component.

27. The program storage device of claim 21, wherein said estimating of said maximum parasitic impedance comprises calculating a resistance of a total length of wiring having an average wire width within an associated net within said component.

* * * * *